United States Patent
Seo

(10) Patent No.: US 10,236,362 B2
(45) Date of Patent: Mar. 19, 2019

(54) NANOWIRE FET INCLUDING NANOWIRE CHANNEL SPACERS

(71) Applicant: International Business Machines Corporation, Armonk, NY (US)

(72) Inventor: Soon-Cheon Seo, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/198,622

(22) Filed: Jun. 30, 2016

(65) Prior Publication Data

US 2018/0006139 A1    Jan. 4, 2018

(51) Int. Cl.
*H01L 21/336* (2006.01)
*H01L 29/78* (2006.01)
(Continued)

(52) U.S. Cl.
CPC .. *H01L 29/66795* (2013.01); *H01L 21/02532* (2013.01); *H01L 21/3065* (2013.01); *H01L 21/30604* (2013.01); *H01L 29/0653* (2013.01); *H01L 29/0673* (2013.01); *H01L 29/42392* (2013.01); *H01L 29/6653* (2013.01); *H01L 29/66439* (2013.01); *H01L 29/66545* (2013.01); *H01L 29/66553* (2013.01);
(Continued)

(58) Field of Classification Search
CPC ............. H01L 29/775; H01L 21/02532; H01L 29/7848; H01L 27/092; H01L 27/0924; H01L 29/78642; H01L 21/30604; H01L 21/3065; H01L 29/66545; H01L 29/66795; H01L 29/785; H01L 29/66439; B82Y 10/00
See application file for complete search history.

(56) References Cited

U.S. PATENT DOCUMENTS 7,456,476 B2    11/2008  Hareland et al.
7,892,945 B2    2/2011   Bedell et al.
(Continued)

FOREIGN PATENT DOCUMENTS

WO    2014142952 A1    9/2014

OTHER PUBLICATIONS

List of IBM Patents or Patent Applictions Treated as Related; (Appendix P), Filed Nov. 20, 2017, 2 pages.
(Continued)

*Primary Examiner* — Caridad Everhart
(74) *Attorney, Agent, or Firm* — Cantor Colburn LLP; Vazken Alexanian

(57) ABSTRACT

A stacked nanowire field effect transistor (FET) including a plurality of vertically stacked nanowire channels. Each nanowire channel is vertically separated from one another by sacrificial segment. A gate stack is on the upper surface of the semiconductor substrate. The gate stack includes a conductive element that wraps around the nanowire channels. Source/drain regions are on the upper surface of the semiconductor substrate. The source/drain regions directly contact the ends of the nanowire channel. The stacked nanowire FET further includes nanowire channel spacers that encapsulate the ends of the nanowire channel such that the source/drain regions are separated from the gate stack.

17 Claims, 7 Drawing Sheets

(51) Int. Cl.
   *H01L 29/66* (2006.01)
   *H01L 29/06* (2006.01)
   *H01L 29/423* (2006.01)
   *H01L 21/306* (2006.01)
   *H01L 21/3065* (2006.01)
   *H01L 21/02* (2006.01)
   *H01L 29/775* (2006.01)

(52) U.S. Cl.
   CPC .......... *H01L 29/775* (2013.01); *H01L 29/785* (2013.01); *H01L 29/7853* (2013.01)

(56) References Cited

U.S. PATENT DOCUMENTS

| | | |
|---|---|---|
| 8,084,308 B2 | 12/2011 | Chang et al. |
| 8,399,330 B2 | 3/2013 | Liu et al. |
| 8,753,942 B2 | 6/2014 | Kuhn et al. |
| 8,969,149 B2 | 3/2015 | Leobangdung |
| 9,024,364 B2 | 5/2015 | Okano |
| 9,034,702 B2 | 5/2015 | Huang et al. |
| 9,064,944 B2 | 6/2015 | Kim et al. |
| 2013/0161756 A1* | 6/2013 | Glass ................ H01L 29/66545 257/369 |
| 2013/0302955 A1* | 11/2013 | Vinet .................... B82Y 10/00 438/197 |
| 2013/0313524 A1 | 11/2013 | De Micheli et al. |
| 2014/0001441 A1 | 1/2014 | Kim et al. |
| 2014/0326952 A1 | 11/2014 | Kuhn et al. |
| 2015/0069328 A1 | 3/2015 | Leobangdung |
| 2015/0333162 A1* | 11/2015 | Bouche ............ H01L 21/76897 257/24 |
| 2016/0211322 A1* | 7/2016 | Kim ................ H01L 29/66795 |
| 2017/0025314 A1* | 1/2017 | Witters .................. B82Y 10/00 |

OTHER PUBLICATIONS

Soon-Cheon Seo, et al., "Nanowire FET Including Nanowire Channel Spacers", U.S. Appl. No. 15/821,041, filed Nov. 22, 2017.

* cited by examiner

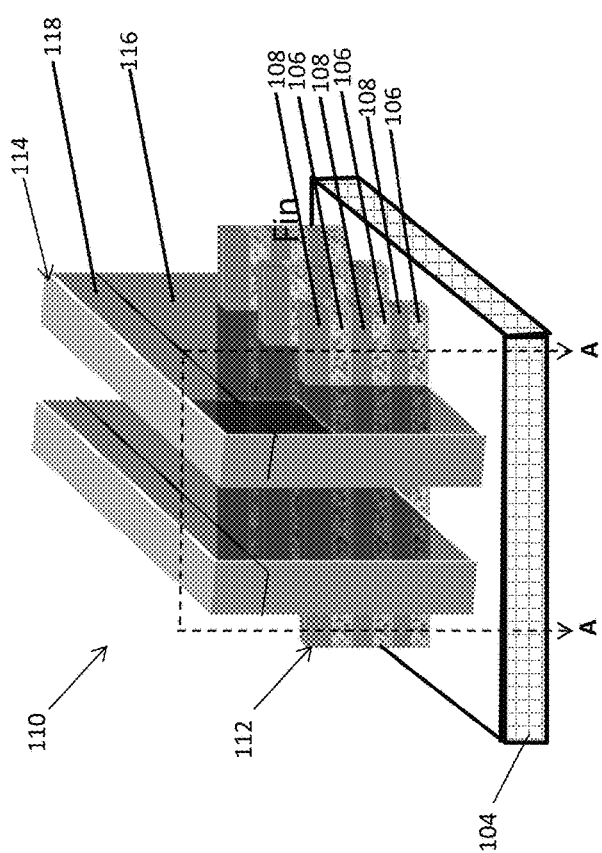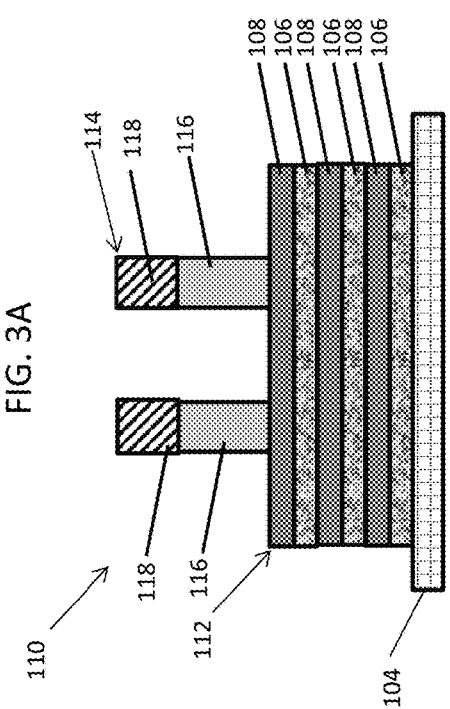

NANOWIRE FET INCLUDING NANOWIRE CHANNEL SPACERS

BACKGROUND

The present invention relates generally to semiconductor devices, and more particularly, to nanowire-type field effect transistors (FETs).

FETs are widely used in the electronics industry for switching, amplification, filtering, and other tasks related to both analog and digital electrical signals. Most common among these are metal-oxide-semiconductor field-effect transistors (MOSFET), in which a gate structure is energized to create an electric field in an underlying channel region of a semiconductor body, by which electrons or holes are allowed to travel through the channel between a source region and a drain region of the semiconductor body. Complementary metal-oxide-semiconductor field-effect transistor, which are typically referred to as CMOS devices, have become widely used in the semiconductor industry. These CMOS devices include both n-type and p-type (NMOS and PMOS) transistors, and therefore promote the fabrication of logic and various other integrated circuitry.

The escalating demands for high density and performance associated with ultra large scale integrated (VLSI) circuit devices have required certain design features, such as shrinking gate lengths, high reliability and increased manufacturing throughput. The continued reduction of design features has challenged the limitations of conventional fabrication techniques. Gate-all-around semiconductor devices, such as nanowire-type FETs, typically include nanowires that are suspended above a substrate such that gate stacks may be formed around the channel region of the nanowire. Nanowire-type FETs may be fabricated as a stacked nanowire FET, which include a number of suspended nanowires stacked in a common plane above the substrate. The stacking of the suspended nanowires allows a number of FET devices to occupy a space on the substrate.

SUMMARY

According to a non-limiting embodiment of the present invention, a stacked nanowire field effect transistor (FET) including a plurality of vertically stacked nanowire channels. Each nanowire channel is vertically separated from one another by sacrificial segment. A gate stack is on the upper surface of the semiconductor substrate. The gate stack includes a conductive element that wraps around the nanowire channels. Source/drain regions are on the upper surface of the semiconductor substrate. The source/drain regions directly contact the ends of the nanowire channel. The stacked nanowire FET further includes nanowire channel spacers that encapsulate the ends of the nanowire channel such that the source/drain regions are separated from the gate stack.

According to another non-limiting embodiment, a method of forming nanowire channel spacers in a nanowire field effect transistor (FET) comprises forming a multi-stack semiconductor fin on an upper surface of a semiconductor substrate. The multi-stack semiconductor fin comprises a plurality of vertically stacked semiconductor material layers including plurality of nanowire channel layers. Each nanowire channel layer is vertically separated from one another by a sacrificial layer. The method further includes forming a gate stack on the upper surface of the semiconductor substrate. The gate stack wraps around the outer surfaces of the multi-stack semiconductor fin. The method further includes forming source/drain regions on the upper surface of the semiconductor substrate. The source/drain regions contact the multi-stack fin and are separated from the gate stack by a void that exposes portions of the sacrificial layers and the nanowire channel layers. The method further includes etching the exposed portions of the sacrificial layers to form cavities that release opposing ends of the nanowire channel layers and form stacked nanowire channels, filing the cavities with a spacer material that encapsulates the released ends and forms the nanowire channel spacers.

According to yet another non-limiting embodiment, a method of forming nanowire channel spacers in a nanowire field effect transistor (FET) comprises forming a first material layer comprising a first semiconductor material on a semiconductor substrate, forming a second semiconductor layer comprising a second semiconductor material on the first layer, and forming a third semiconductor layer comprising the first semiconductor material on the second layer. The method further comprises patterning the first, second, and third semiconductor layers to form a multi-layer semiconductor fin. The fin includes a channel layer portion comprising the second semiconductor material interposed between first and second sacrificial layer portions comprising the first semiconductor material. The method further comprises forming a sacrificial gate stack that wraps around the exterior surfaces of the multi-layer semiconductor fin, and forming source/drain regions on the substrate so as to define a void between the sacrificial gate stack and the source/drain regions that exposes portions of the sacrificial layer portions and the channel layer portion. The method further comprises removing the exposed portions of the sacrificial layer portions to form cavities that release ends of the channel layer portion and define a nanowire channel. The method further comprises filling the cavities with a spacer material to form the nanowire channel spacers that encapsulate the ends of the channel layer portion.

Additional features are realized through the techniques of the present invention. Other non-limiting embodiments are described in detail herein and are considered a part of the claimed invention. For a better understanding of the invention with the features, refer to the description and to the drawings.

BRIEF DESCRIPTION OF THE DRAWINGS

FIGS. 1-10 are a series of views illustrating a process flow of fabricating a semiconductor device, in which:

FIG. 1 is a perspective view of a substrate including alternating layers of semiconductor materials stacked on an upper surface of the substrate;

FIG. 2 is a perspective view of an intermediate semiconductor device formed after etching the stacked alternating first and second semiconductor materials shown in FIG. 1 to form one or more semiconductor fins including a fin body having alternating layers of semiconductor materials;

FIG. 3A is a perspective view of the intermediate semiconductor device of FIG. 2 following formation of one or more gate stacks that are formed on the upper surface of the substrate and wrap around the exposed surfaces of the semiconductor fins;

FIG. 3B is a cross-sectional view of view of the intermediate semiconductor device shown in FIG. 3A taken along line A-A;

FIG. 4 illustrates the intermediate semiconductor device shown in FIG. 3B following deposition of a sacrificial layer that conforms to exposed surfaces of the semiconductor fin and exposes surfaces of the gate stack;

FIG. 5 illustrates the intermediate semiconductor device shown in FIG. 4 following a directional etching process that recesses portions of the semiconductor fin to expose portions of the upper surface of the substrate and forms sacrificial spacers on sidewalls of the gate stack;

FIG. 6 illustrates the intermediate semiconductor device shown in FIG. 5 following an epitaxial growth process to form source/drain (S/D) regions on the exposed upper surface portions of the substrate which abut against the sacrificial spacers;

FIG. 7 illustrates the intermediate semiconductor device shown in FIG. 6 after removing the sacrificial spacers to form a void between the gate stacks and the adjacent S/D regions;

FIG. 8 illustrates the intermediate semiconductor device shown in FIG. 7 following a selective etching process that etches away a portion of the second semiconductor material while preserving the first semiconductor material to form a plurality of stacked semiconductor nanowire channels;

FIG. 9 illustrates a resultant semiconductor device following deposition of a gate spacer layer that fills open cavities located between the stacked nanowire channels and conforms to the exposed surfaces of the S/D regions and the gate stack; and FIG. 10 illustrates the semiconductor device of FIG. 9 following a replacement metal gate (RMG) process that replaces a dummy gate element with a conductive gate material.

DETAILED DESCRIPTION

Figure 1:
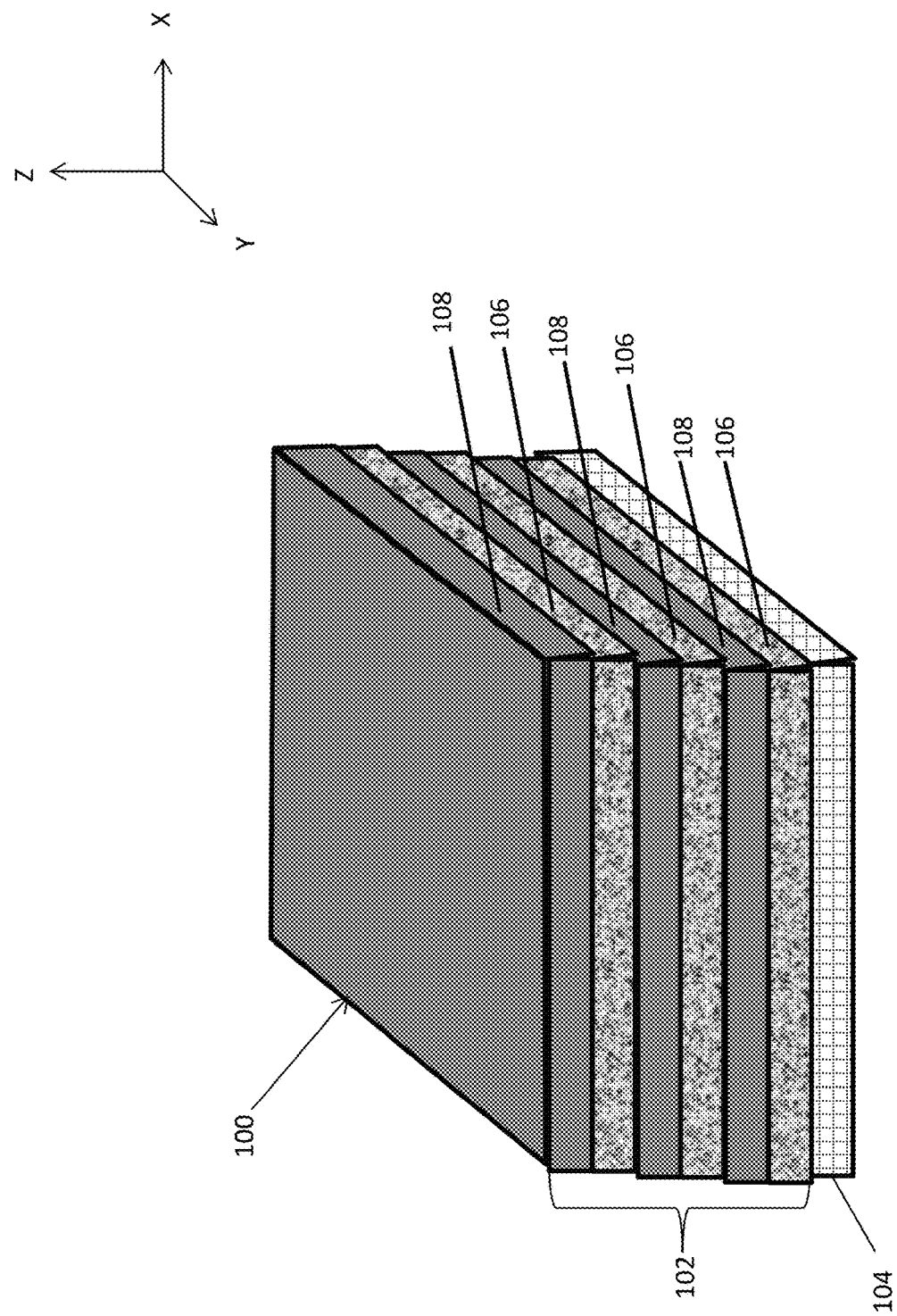

Various non-limiting embodiments are described herein with reference to the related drawings. Alternative embodiments may be devised without departing from the scope of the invention. It is noted that various connections and positional relationships (e.g., over, below, adjacent, etc.) are set forth between elements in the following description and in the drawings. These connections and/or positional relationships, unless specified otherwise, may be direct or indirect, and the various embodiments described herein are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

For the sake of brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more non-limiting embodiments described herein will now be provided. Although specific fabrication operations used in implementing one or more non-limiting embodiments may be individually known, the disclosed combination of operations and/or resulting structures described herein are unique. Thus, the unique combination of the operations described in connection with the fabrication of a coupler system utilize a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview, forming channel spacers in nanowire FETs can be challenging because the reduced footprint of the device causes undercutting into the gate stack. The chances of undercutting into the gate stack increase when the process of recessing the semiconductor fin ends (to define the designated areas for epitaxially growing the source/drain regions) is performed after the final gate spacers are formed on the gate stack. Undercutting into the gate stack undesirably creates the possibility of exposing the gate stack (e.g., the polySi or conductive gate material) during the source/drain epitaxially growth process, which in turn causes shorting between the grown source/drain regions and the gate.

Various non-limiting embodiments of the invention provide a stacked nanowire FET that forms nanowire channel spacers without undercutting into the gate stack. Sacrificial spacers are formed prior to forming the source/drain regions. These sacrificial spacers are subsequently removed thereby forming a void between the source/drain regions and the gate stack. The void allows access to the underlying multi-layer fin such that a nanowire release process may be performed. The void is then re-filled with a spacer material to form the nanowire channel spacers. Because the nanowire channel spacers are created after forming the source/drain regions, undercutting into the gate channel is avoided which in turn prevents the possibility of shorting the source/drain regions and the gate.

Turning now to a more detailed discussion of one or more embodiments, with reference now to FIG. 1, a substrate 100 including a multi-layer stack 102 comprising alternating layers of semiconductor materials formed on an upper surface of a semiconductor layer 104 (i.e., a semiconductor handle layer 104) is illustrated according to a non-limiting embodiment. The substrate 100 extends along a first axis (e.g., X-axis) to define a length, a second axis (e.g., Y-axis) to define a width, and a third axis (e.g., Z-axis) to define a height. The substrate 100 may include a bulk semiconductor substrate or a semiconductor-on-insulator (SOI) substrate. In either case, the substrate 100 comprises a semiconductor material such as, for example, silicon (Si).

The multi-layer stack 102 includes an alternating stacked arrangement of semiconductor layer materials. The semiconductor layer materials include a first semiconductor material layer 106 and a second semiconductor material layer 108 arranged on the first semiconductor material layer 106. The multi-layer stack 102 may include any number of alternating semiconductor material layers 106 and 108. In the illustrated embodiment, the first semiconductor material layer 106 comprises silicon germanium (SiGe), for example, while the second semiconductor material layer 108 comprises, for example, silicon (Si). The multi-layer stack 301 may be formed by any suitable process. In an embodiment, a first semiconductor material layer (e.g., a SiGe layer) is formed on an upper surface of the substrate 100. Thereafter, a second semiconductor layer (e.g., a Si layer) is formed on an upper surface of the first semiconductor material layer. The difference in semiconductor material composition between the first and second semiconductor material layers allows for selectively etching one of the semiconductor layers with respect to the remaining semiconductor layer. For example, a selective etching process may be performed that etches the Si layers while preserving the SiGe layers as discussed in greater detail below.

The layers of semiconductor materials may continue to be formed in an alternating arrangement to form the multi-layer stack 301 as illustrated in FIG. 1. According to a non-limiting embodiment, the thickness (e.g., the vertical distance in along the Z-axis) ranges, for example, from approximately 4 nanometers (nm) to approximately 20 nm. Although the initial semiconductor material formed directly on the upper surface of semiconductor layer 104 is illustrated as being a SiGe layer 106 it should be appreciated that an Si layer 108 may initially be formed on the upper surface of the semiconductor layer 104 and a SiGe layer 106 may then be formed on an upper surface of the Si layer 108 without departing from the scope of the invention. In addition, the uppermost semiconductor layer included in the multi-stack 102 is illustrated as being a Si layer 108. It should be appreciated, however, that another SiGe layer 106 can be formed atop the Si layer 108 such that an SiGe layer 106 is the uppermost layer (e.g., the layer further from semiconductor layer 104) included in the multi-layer stack 102.

The first and second semiconductor layers can be formed according to an epitaxial growth process. For example, the substrate 100 may be used as a seed layer to epitaxially grow the first semiconductor material layer (e.g., a SiGe layer). Thereafter, the first semiconductor material layer may be utilized as a seed layer to epitaxially grow the second semiconductor layer (e.g., a Si layer). The epitaxy process used to form the first and second semiconductor layer may be carried out using vapor phase epitaxy (VPE), molecular beam epitaxy (MBE) or liquid phase epitaxy (LPE) with a gaseous or liquid precursor, such as, for example, silicon tetrachloride.

Figure 2:
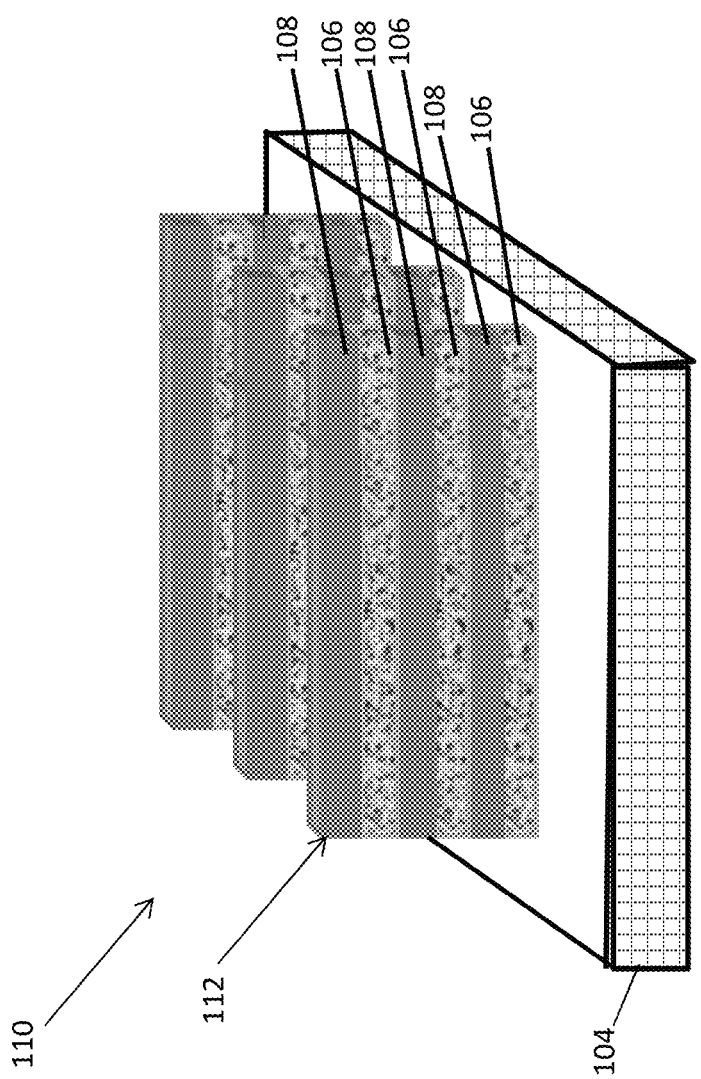

Turning now to FIG. 2, the multi-layer stack is etched to form an intermediate semiconductor device 110 that includes one or more multi-layer semiconductor fins on 112 an upper surface of the substrate 100. The multi-layer semiconductor fins 112 include a fin body having alternating layers of stacked semiconductor materials 106-108 arranged according to the original multi-layer stack. The semiconductor material may be selected such that a first group of semiconductor layers (e.g., the first semiconductor layers 106) is configured as a sacrificial fin layer while the second group of semiconductor layers (e.g., the second semiconductor layers 108) are configured as nanowire channel layers. In this manner, the sacrificial fin layers can be selectively etched away so as to release the nanowire channel layers to form a stacked nanowire FET as described in greater detail below.

Various patterning techniques may be used to form the multi-layer fins 112. For example, a suitable hardmask blocking layer (not shown) formed of silicon dioxide (SiO2), for example, can be initially deposited on an upper surface of the multi-layer stack. In this case, for example, the hardmask blocking layer would be formed on an upper surface of the uppermost SiGe layer shown in FIG. 1. Next, a suitable hardmask cap layer (not shown) formed of silicon nitride (SiN), for example, is deposited atop the hardmask blocking layer. The hardmask cap layer and the hardmask blocking layer are used to pattern the underlying multi-layer stack. For instance, the hardmask blocking layer and the hardmask cap layer are etched to define the desired multi-layer fin pattern.

A developed photoresist mask (not shown) is typically used to define the desired fin pattern. The hardmask blocking layer and hardmask cap layer can then be patterned selective to the developed photoresist mask using, for example, a reactive ion etch (RIE) process. The patterned hardmask layers may then be used to transfer the desired fin pattern into the underlying multi-layer stack according to a RIE process, for example, to define one or more of the multi-layer semiconductor fins on the upper surface of the substrate 100 as illustrated in FIG. 2. A portion of the upper surface of the semiconductor layer 104 is also exposed following the etching process used to form the multi-layer fins. It should be appreciated that the length and width of the patterning can be determined according to the desired fin dimensions for the particular application. The height of the multi-layer fins (e.g., the distance of the fins extending along the Z-axis) ranges, for example, from approximately 4 nm to approximately 20 nm.

Referring to FIGS. 3A-3B, the intermediate semiconductor device is illustrated following the formation of one or more gate stacks 114. The gate stacks 114 are formed on the upper surface of the semiconductor handle layer 104 and wrap around the exposed surfaces of the multi-layer fins 112. The gate stacks 114 are formed from a sacrificial (i.e., dummy) gate material such as polycrystalline silicon (polySi), for example, and is formed using various patterning techniques. For example, the gate stacks may be formed by first depositing thin gate oxide and a gate material. In a gate first scheme, the gate material may include metal gate material. In a gate last scheme, the gate material may include a sacrificial gate material. The sacrificial gate material including, but is not limited to, PolySi, amorphous Si (aSi) amorphous carbon (Ac), or dielectric material on the upper surface of the substrate to completely cover the multi-layer fins. The gate material may be applied using various deposition processes, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

Following the deposition of the polySi material, a hard mask layer (not shown) such as, for example, silicon nitride (SiN), SiOCN, or SiBCN or an oxide material is deposited on the layer of sacrificial gate material 116 to form a gate hard mask or sacrificial gate cap 118. The hardmask layer may be deposited using a deposition process, including, but not limited to, PVD, CVD, PECVD, or any combination thereof. Following the deposition of the hardmask layer, a lithographic patterning and etching process such as, for example, a RIE process is performed to remove exposed portions of the hardmask layer and the layer of sacrificial gate material form the gate stacks 114. The length and width of the gate stacks 114 may vary according to the desired fin dimensions for the particular application. Accordingly, the gate stacks 114 include a sacrificial gate element 116, and a gate cap 118 formed on an upper surface of the sacrificial gate element 116 as further illustrated in FIGS. 3A-3B.

Figure 4:
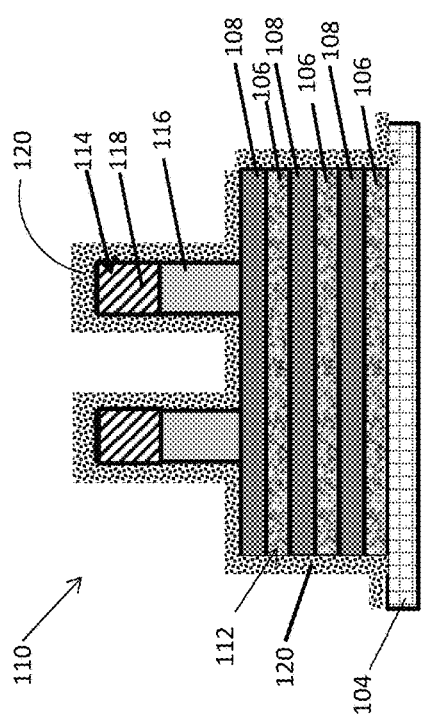

With reference to FIG. 4, the intermediate semiconductor device is illustrated following deposition of a conformal sacrificial spacer layer 120. The sacrificial spacer layer 120 may comprise various nitride materials such as silicon nitride (SiN), for example, and may be deposited using a deposition process, including, but not limited to, PVD, CVD, PECVD, or any combination thereof. The sacrificial spacer layer 120 may comprise a different material than the material used to form the dummy gate stack (i.e., the sacrificial gate element 116 and/or the gate cap 118). The thickness of the sacrificial spacer layer 120 may range, for example, from approximately 4 nm to approximately 20 nm.

Figure 5:
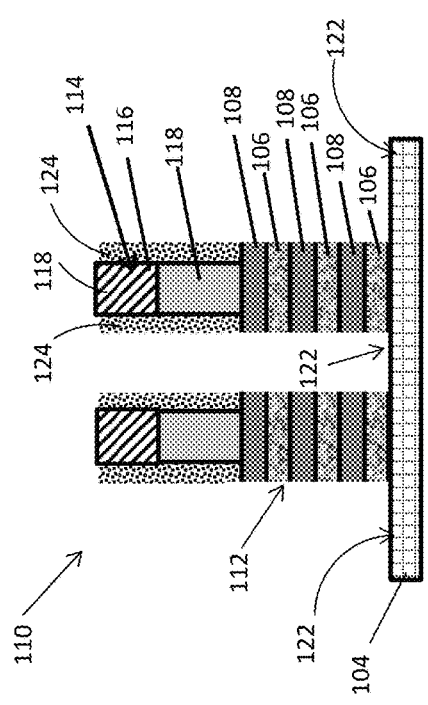

Turning to FIG. 5, the intermediate semiconductor device 110 is illustrated following a directional etching process. The directional etching process includes, for example, a RIE process. The ME process performed at this stage of the process flow recesses end portions of the multi-layer fins 112. Accordingly, upper surface portions 122 of the semiconductor handle layer 104 are exposed between the multi-layer fins 112 and also between sidewalls of the remaining fins and the edge of the semiconductor handle layer.

Still referring to FIG. 5, the ME process also removes portions of the sacrificial spacer layer 120 from upper surfaces of the semiconductor handle layer 104, sidewalls of the multi-layer fins 112, and the upper surface of the gate caps 118. When the gate gaps 118 and the sacrificial spacer layer 120 are formed of the same material, it should be appreciated that the vertical thickness of the gate caps 118 are greater than the vertical thickness of the sacrificial spacer layer 120 such that a sufficient amount of the gate caps 118 remains after completing the ME process.

Following the RIE process, the remaining sacrificial spacer layer forms sacrificial gate spacers 124 on sidewalls of the gate stack 114 as further illustrated in FIG. 5. The sacrificial gate spacers 124 extend vertically (i.e., along the Z-axis) from an upper surface of the multi-layer fin 112 (e.g., the upper surface of the upper-most semiconductor layer 108) to the upper surface of the gate cap 118. A chemical-mechanical planarization (CMP) process may be performed such that the upper surface of the sacrificial spacers 124 is flush with the upper surface of a respective gate cap 118.

Although a single RIE etching process is described to form the sacrificial spacers 124, the sacrificial spacers 124 can be formed using two different etching processes. For example, a first etching process such as, for example, a first RIE process selectively removes the portions of the sacrificial spacer layer 120 from upper surfaces of the semiconductor handle layer 104, sidewalls of the multi-layer fins 112, and the upper surface of the gate caps 118. Accordingly, the remaining sacrificial spacer layer forms the sacrificial gate spacers 124 on sidewalls of the gate stack 114. Thereafter, a second etching process such as, for example, a second RIE process is performed to recess the end portions of the multi-layer fins 112. Accordingly, upper surface portions 122 of the semiconductor handle layer 104 are exposed between the multi-layer fins 112 and also between sidewalls of the remaining fins and the edge of the semiconductor handle layer.

Figure 6:
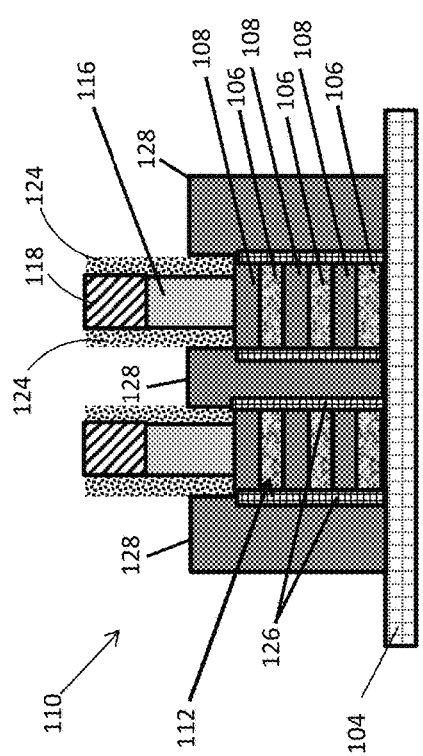

Turning to FIG. 6, the intermediate semiconductor device 110 is illustrated following formation of a thin buffer layer 126. The thin buffer layer 126 is formed by growing a thin film of Si, for example, from sidewalls or the cut ends for the multi-stack 102. The buffer layer 126 ranges, for example, from approximately 1 nm to approximately 5 nm. The buffer layers 126 are capable of defining and controlling the short channel junction of the device. The buffer layers 126 are omitted from the drawings described going forward for purposes of clarifying the formation of voids for accessing the multi-layer fin 112 (discussed in greater detail below). It should be appreciated, however, that the buffer layer 126 exists in the final device.

Still referring to FIG. 6, source/drain (S/D) regions 128 are formed atop the semiconductor layer 104. The S/D regions 128 may be epitaxially grown using the sidewalls of the multi-layer fins 112 as a seed layer. The thin buffer layers 126 may also act as an additional seed layer in some embodiments. When forming a p-type semiconductor device, the S/D regions 128 are formed by epitaxially growing SiGe, for example, from the buffer regions 126 and/or the sidewalls of the multi-layer fins 112. When forming an n-type semiconductor device, the S/D regions 128 are formed by epitaxially growing silicon phosphorus (SiP), for example, from the buffer regions 126 and/or the sidewalls of the multi-layer fins 112.

The S/D regions 128 may have a height (e.g., distance extending along the Z-axis) ranging from approximately 5 nm to approximately 20 nm. The S/D regions 128 can have a height greater than a height of the multi-layer fin 112. In this manner, the S/D regions 128 extend above the upper surface of the multi-layer fins 112 such that a portion of the S/D regions 128 contacts a portion of the sacrificial spacers 124. That is, the sacrificial spacers 124 are directly interposed between an upper portion of the S/D regions 128 and the gate stacks 114.

Figure 7:
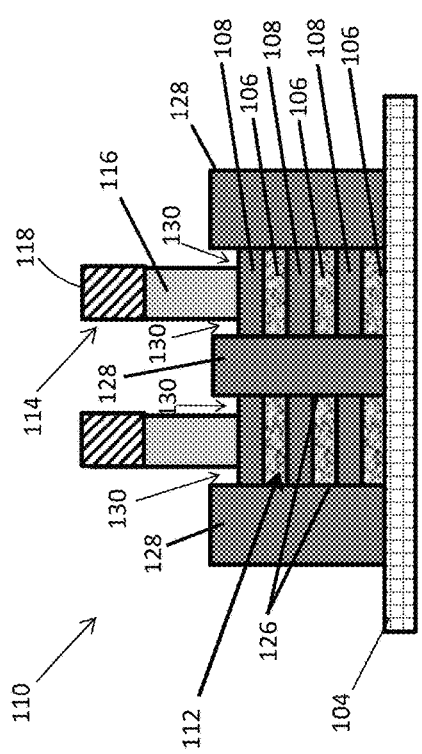

Turning to FIG. 7, a selective etching process is performed that etches away the sacrificial spacers 124 with respect to the gate stacks 114, the multi-layer fins 112 and the S/D regions 128. That is, the sacrificial spacers 124 are etched away while substantially preserving the multi-layer fins 112, the gate stacks 114 and the S/D regions 128. Various etching processes may be used to remove the sacrificial spacers 124 including, but not limited to, a hydrofluoric-based (HF-based) wet chemistry. A gate hard mask 118 can comprise a wet etch resistant material like silicon borocarbonitride (SiBCN) or dry plasma etching using carbon fluoride (CF4) or sulfur hexafluoride (SF6) based chemistry. The removal of the sacrificial spacers 124 creates voids 130 between the gate stacks 114 and the adjacent S/D regions 128 as well as between the multi-layer fins 112. The voids 130 provide access to the alternating semiconductor layers 106-108 of the multi-layer fin 112.

Figure 8:
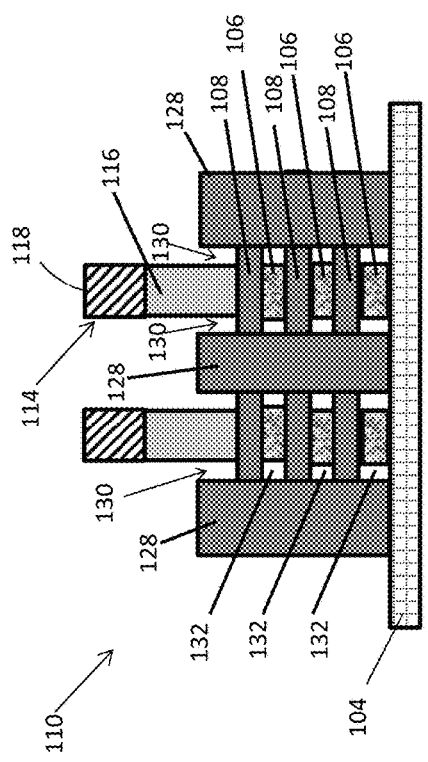

Referring now to FIG. 8, the intermediate semiconductor device 110 is illustrated following an etching process that is selective to the second semiconductor layer 108 of the multi-layer fin 112 is performed. That is, the etching process removes exposed portions of the first semiconductor layers 106 while preserving exposed portions of the second semiconductor layers 108. In this manner, cavities 132 are formed between vertically adjacent second semiconductor material layers 108. The cavities 132 release the preserved second semiconductor layers 108 so to define stacked nanowire channels 108. Each nanowire channel 108 is vertically separated from one another by remaining segments of the sacrificial layer 106 (i.e., sacrificial segments 106). Various etching processes may be used to remove the portions of first semiconductor material layer 106 including, but not limited to, an etching process utilizing a wet etchant comprising hot standard clean 1 cycle (SC1) etch or a dry etching process comprising hydrogen chloride (HCl).

Figure 9:
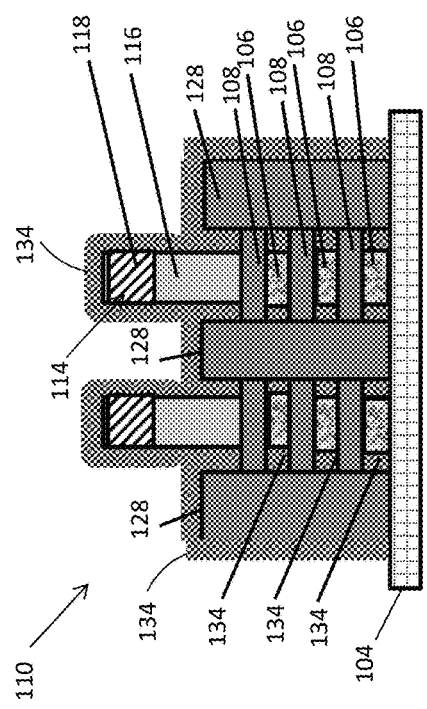

Turning to FIG. 9, a resulting semiconductor device 110 following a low-dielectric constant (low-K, K<6 for this application) material deposition process. A low-K material 134 such as but not limited to silicon oxycarbonitrid (SiOCN), SiBCN, or silicon dioxide (SiO2), for example, is deposited to fill the cavities (previously indicated as numeral 132) and the voids (previously indicated as numeral 130), and conform to the exposed surfaces of the nanowire channels 108, the S/D regions 128, and the gate stacks 114. The thickness of the low-K material 134 ranges, for example, from approximately 5 nm to approximately 20 nm. As further illustrated in FIG. 9, The low-k material 134 essentially forms nanowire channel spacers 134 for the nanowire channels that do not undercut into the gate channel. In this manner, a stacked nanowire FET having a reduced footprint is fabricated while relieving concerns of shorting between the source/drain regions and the gate.

The nanowire channel spacers 134 encapsulate the released ends of the nanowire channels 108 such that the source/drain regions 128 are separated from the gate stacks 114. The cross-sectional view of FIG. 9 shows the nanowire channel spacers 134 are interposed between the source/drain regions 126 and ends of the sacrificial segments 106. In addition, the nanowire channel spacers 134 are interposed between each pair of vertically stacked nanowire channels 108.

Figure 10:
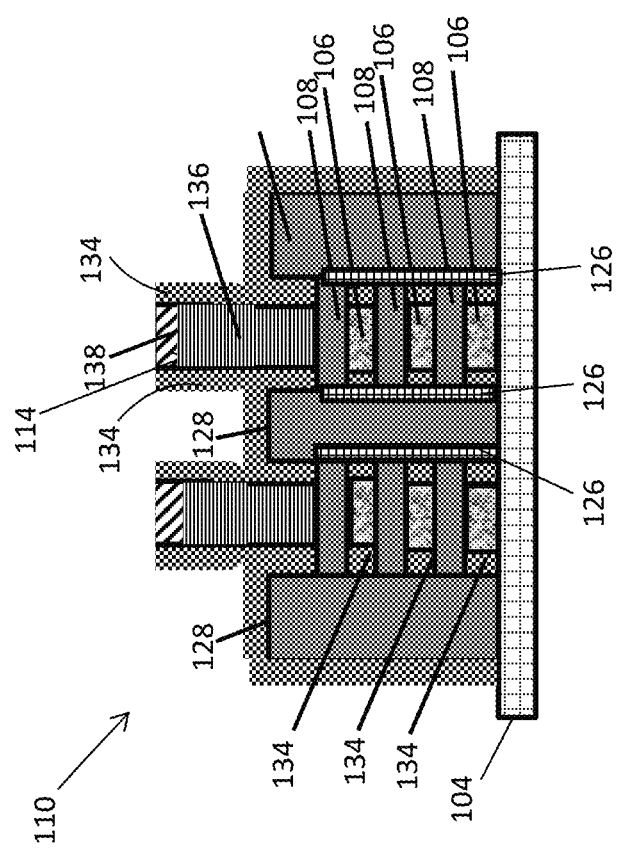

Turning to FIG. 10, the semiconductor device 110 is illustrated following a replacement metal gate (RMG) process that replaces the sacrificial gate material 116 with a conductive gate material 136. The conductive gate material 136 may be formed from various electrically conductive materials including, but not limited to, tungsten (W). A gate cap 138 comprising a dielectric material including, but not limited to, $Si_3N_4$, SiBCN, SiOCN, or $SiO_2$, for example, may also be formed atop the conductive gate material 136. The gate cap 138 may protect the underlying conductive gate material 136 when performing various subsequent fabrication processes.

Although not illustrated, it should be appreciated that the gate stack 114 may include one or more work function metal layers including, but not limited to, a titanium nitride (TiN) liner and a tantalum nitride (TaN) liner, formed on sidewalls of the conductive gate material 136 (i.e., between the conductive gate material 136 and the spacers 134 as understood by one of ordinary skill in the art. A gate dielectric layer (not shown), such as a single layer or multi-layer high-k gate dielectric layer may also be disposed atop the semiconductor layer 104 prior to depositing the conductive gate material 136. In this case, it should be appreciated that the gate stack 114 includes the conductive gate material 136, the gate dielectric layer, and the work function metals. It should also be appreciated that a chemical-mechanical planarization (CMP) process may be performed to recess any excess dielectric material used to form the gate cap layers 138. The CMP process can be halted once reaching the upper surface of the spacers 134 such that the upper surface of the gate cap layer 138 formed flush with the upper surface of the spacers 134 as further illustrated in FIG. 10.

As described herein, various non-limiting embodiments provide a stacked nanowire FET that forms nanowire channel spacers having reduced source/drain to gate stack shorting paths. Sacrificial spacers are formed prior to forming the source/drain regions. The sacrificial spacers are subsequently removed thereby forming a void between the source/drain regions and the gate stack. The void allows access to the underlying multi-layer fin such that the sacrificial layers can be selectively etched with respect to the nanowire channel layers so as to form cavities that define the stacked nanowire channels. The cavities and the void are then re-filled with a spacer material to form the nanowire channel spacers. Because the nanowire channel spacers are created after forming the source/drain regions, undercutting into the gate channel is avoided which in turn prevents the possibility of shorting the source/drain regions and the gate.

The descriptions of the various non-limiting embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming nanowire channel spacers in a nanowire field effect transistor (FET), the method comprising:

forming a multi-stack semiconductor fin on an upper surface of a semiconductor substrate, the multi-stack semiconductor fin comprising a plurality of vertically stacked semiconductor material layers including plurality of nanowire channel layers, each nanowire channel layer vertically separated from one another by a sacrificial layer;

forming a gate stack on the upper surface of the semiconductor substrate, the gate stack wrapping around the outer surfaces of the multi-stack semiconductor fin;

forming source/drain regions on the upper surface of the semiconductor substrate, the source/drain regions contacting the multi-stack fin and being separated from the gate stack by a void that exposes portions of the sacrificial layers and the nanowire channel layers;

etching the exposed portions of the sacrificial layers to form cavities that release opposing ends of the nanowire channel layers and form stacked nanowire channels; and filing the cavities with a spacer material that encapsulates the released ends and forms the nanowire channel spacers, wherein the gate stack and the sacrificial spacers comprise the same dielectric material, and wherein the gate stack includes a gate cap having a first thickness that is greater than a second thickness of the sacrificial spacers.

2. The method of claim 1, wherein the spacer material comprises a low-dielectric (low-K) material.

3. The method of claim 1, wherein the nanowire channel spacers are interposed between the source/drain regions and the gate stack.

4. The method of claim 3, wherein forming the source/drain regions further comprises:
forming sacrificial spacers on sidewalls of the gate stack prior to forming the source/drain regions;
after forming the sacrificial spacers, epitaxially growing the source/drain regions such that the sacrificial spacers are interposed between the source/drain regions and the gate stack; and
selectively etching the sacrificial spacers to form the voids that expose the portions of the sacrificial layers and the nanowire channel layers.

5. The method of claim 4, wherein the gate stack comprises a first dielectric material and the sacrificial spacers comprises a second dielectric material different from the first dielectric material.

6. The method of claim 1, wherein the sacrificial layers comprise silicon germanium (SiGe) and the nanowire channel layers comprises silicon (Si).

7. The method of claim 6, wherein forming the stacked nanowire channels includes performing a selective etching process comprising at least one of a hot standard clean 1 cycle (SC1) wet etch and a hydrochloride (HCl) dry etchant that etches the sacrificial layers while maintaining the nanowire channel layers.

8. The method of claim 1, wherein filing the cavities with the spacer material further comprises forming the spacer material on remaining portions of the sacrificial material located beneath the gate stack.

9. A method of forming nanowire channel spacers in a nanowire field effect transistor (FET), the method comprising:
forming a first material layer comprising a first semiconductor material on a semiconductor substrate;
forming a second semiconductor layer comprising a second semiconductor material on the first layer;
forming a third semiconductor layer comprising the first semiconductor material on the second layer;
patterning the first, second, and third semiconductor layers to form a multi-layer semiconductor fin including a channel layer portion comprising the second semiconductor material interposed between first and second sacrificial layer portions comprising the first semiconductor material;
forming a sacrificial gate stack that wraps around the exterior surfaces of the multi-layer semiconductor fin, and forming source/drain regions on the substrate so as to define a void between the sacrificial gate stack and the source/drain regions that exposes portions of the sacrificial layer portions and the channel layer portion;
removing the exposed portions of the sacrificial layer portions to form cavities that release ends of the channel layer portion and define a nanowire channel; and
filling the cavities with a spacer material to form the nanowire channel spacers that encapsulate the ends of the channel layer portion,
wherein the sacrificial gate stack and the sacrificial spacers comprise the same dielectric material, and wherein the sacrificial gate stack includes a gate cap having a first thickness that is greater than a second thickness of the sacrificial spacers.

10. The method of claim 9, wherein filing the cavities with the spacer material further comprises forming the spacer material on remaining portions of the first and second sacrificial layer portions located beneath the sacrificial gate stack.

11. The method of claim 9, wherein the nanowire channel spacers are interposed between the source/drain regions and the sacrificial gate stack.

12. The method of claim 11, wherein forming the nanowire channel spacers includes depositing a low-dielectric (low-K) material in the cavities.

13. The method of claim 11, wherein the sacrificial gate stack comprises a first dielectric material and the sacrificial spacers comprises a second dielectric material different from the first dielectric material.

14. The method of claim 11, wherein forming the source/drain regions further comprises:
forming sacrificial spacers on sidewalls of the sacrificial gate stack prior to forming the source/drain regions;
after forming the sacrificial spacers, epitaxially growing the source/drain regions from sidewalls of the multi-layer semiconductor fin such that the sacrificial spacers are interposed between the source/drain regions and the sacrificial gate stack; and
selectively etching the sacrificial spacers to form the voids that expose the portions of the sacrificial layers and the channel layer.

15. The method of claim 14, further comprising replacing the sacrificial gate stack with an electrically conductive gate material such that the electrically conductive gate material covers the channel layer portion and the first and second sacrificial layer portions.

16. The method of claim 9, wherein the sacrificial layers comprise silicon germanium (SiGe) and the channel layer comprises silicon (Si).

17. The method of claim 16, wherein defining the nanowire channel includes performing a selective etching process comprising hot standard clean 1 cycle (SC1) wet etching or a hydrochloride (HCl) dry etchant that etches the sacrificial layers while maintaining the channel layer.

* * * * *